US010109499B2

United States Patent
Ye

(10) Patent No.: US 10,109,499 B2
(45) Date of Patent: Oct. 23, 2018

(54) ETCHING METHOD AND SUBSTRATE

(71) Applicant: Shenzhen China Star Optoelectronics Technology Co., Ltd., Shenzhen, Guangdong (CN)

(72) Inventor: Jiangbo Ye, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 40 days.

(21) Appl. No.: 14/778,109

(22) PCT Filed: Mar. 11, 2015

(86) PCT No.: PCT/CN2015/073986
§ 371 (c)(1),
(2) Date: Nov. 21, 2016

(87) PCT Pub. No.: WO2016/134558
PCT Pub. Date: Sep. 1, 2016

(65) Prior Publication Data
US 2017/0186625 A1   Jun. 29, 2017

(30) Foreign Application Priority Data

Feb. 27, 2015 (CN) .......................... 2015 1 0089744

(51) Int. Cl.
*H01L 21/302* (2006.01)
*H01L 21/3213* (2006.01)
*H01L 21/311* (2006.01)
*H01L 21/02* (2006.01)
*H01L 21/67* (2006.01)
*H01L 21/461* (2006.01)

(52) U.S. Cl.
CPC .. *H01L 21/32134* (2013.01); *H01L 21/02071* (2013.01); *H01L 21/31116* (2013.01); *H01L 21/67069* (2013.01); *H01L 21/67086* (2013.01)

(58) Field of Classification Search
None
See application file for complete search history.

(56) References Cited

U.S. PATENT DOCUMENTS

2011/0079776 A1* 4/2011 Choi .................... C23F 1/02
257/43

* cited by examiner

*Primary Examiner* — Roberts P Culbert
(74) *Attorney, Agent, or Firm* — Kim Winston LLP

(57) ABSTRACT

Disclosed is an etching method and a substrate. The etching method comprises: putting a substrate to be etched, which is coated with a photoresist layer, into an etching solution, and etching a metal layer of the substrate to be etched, to obtain a first substrate; and etching a first insulation layer of the first substrate with a reactive ion etching procedure, and then removing the photoresist layer, to obtain a substrate with a second insulation layer thereof being non-etched. The method is used to effectively prevent over-etching of the substrate that would be otherwise caused by an ICP etching procedure. This ensures homogeneity and reliability of the substrate obtained after etching.

9 Claims, 6 Drawing Sheets

ETCHING METHOD AND SUBSTRATE

CROSS-REFERENCE TO RELATED APPLICATIONS

The present application claims benefit of Chinese patent application CN 201510089744.X, entitled "Etching method and substrate" and filed on Feb. 27, 2015, the entirety of which is incorporated herein by reference.

FIELD OF THE INVENTION

The present disclosure relates to the technical field of semiconductors, and in particular, to an etching method and a substrate.

BACKGROUND OF THE INVENTION

Liquid crystal display devices, due the advantages of high definition, small size, light weight, low driving voltage, low power consumption, and the like, have been widely used in various IT digital products, such as automobile guidance systems, engineering workstations, monitors, portable information terminals, electronic terminals, electronic books, notebook computers, and large-scale direct view flat-panel televisions.

As one of the most important components of a liquid crystal display device, a liquid crystal display substrate can be manufactured through three stages including an array procedure, a cell procedure, and a module procedure, wherein the array procedure is performed to form a TFT loop on a glass substrate, and further includes washing, film forming, photoetching, and examining steps, among others.

ICP etching, which is widely used among existing LTPS procedures, includes rather complex chemical and physical steps. The chemical steps substantially comprise two portions: one portion is glow discharge of an etching gas through inductive coupling, to produce active free radicals, metastable particles, atoms, and chemical interactions thereamong; and the other portion involves interactions between these active particles generated in the glow discharge of the etching gas and a surface of the substrate. The physical steps mainly include bombardment against the surface of the substrate by ions.

ICP etching has the advantages of anisotropy, high etching rates, controllable procedures, and the like. However, due to a comparatively large power density, ICP etching would cause GI-SIOx losses in practical manufacturing procedures, thereby deteriorating homogeneity of the substrate.

SUMMARY OF THE INVENTION

The present disclosure aims to solve the technical problem of over-etching of a metal silicon oxide insulation layer caused by use of an ICP etching procedure according to an existing etching method for a substrate. In order to solve the above problem, an etching method is first provided in an embodiment of the present disclosure, comprising:

a wet etching step, which includes: putting a substrate to be etched, which is coated with a photoresist layer, into an etching solution, and etching a metal layer of the substrate to be etched, to obtain a first substrate; and a reactive ion etching step, which includes: etching a first insulation layer of the first substrate with a reactive ion etching procedure, and then removing the photoresist layer, to obtain a substrate with a second insulation layer thereof being non-etched.

According to one embodiment of the present disclosure, the wet etching step further includes rinsing and/or drying the substrate after the metal layer of the substrate to be etched is etched.

According to one embodiment of the present disclosure, the wet etching step further includes stirring the etching solution.

According to one embodiment of the present disclosure, the wet etching step further includes degassing the etching solution.

According to one embodiment of the present disclosure, the etching solution comprises sulfuric acid, nitric acid, and/or acetic acid.

According to one embodiment of the present disclosure, in the etching solution, the proportions of sulfuric acid, nitric acid, and acetic acid are respectively 1.8%, 67%, and 17%.

According to one embodiment of the present disclosure, an etching gas mixture is used to etch the first insulation layer of the first substrate, and in the reactive ion etching step, a selection ratio of etching is adjusted through adjustment of proportions of various gases in the etching gas mixture.

According to one embodiment of the present disclosure, the etching gas mixture comprises chlorine and sulfur fluoride.

According to one embodiment of the present disclosure, in the reactive ion etching step, an etching rate is further adjusted through adjustment of flow of the etching gas mixture.

A substrate is further provided in the present disclosure, wherein the substrate is manufactured with the etching method according to any one of the above embodiments.

According to the etching method of the present disclosure, a wet etching procedure and an RIE procedure are used to effectively prevent over-etching of the second insulation layer (i.e., metal silicon oxide insulation layer) that would be otherwise caused by the ICP etching procedure used in the existing etching method. This ensures homogeneity and reliability of the substrate obtained after etching, and enables parameters of the substrate, such as electric mobility, resistance, and capacitance thereof, to be equal to or approximate to specified values, thereby guaranteeing yield of the substrate.

In addition, compared with the ICP etching device as used in the existing etching method, the wet etching device and the RIE device used in the present disclosure are of lower costs. Therefore, the method of the present disclosure can be used favorably for lowering manufacturing costs and improving production efficiency of the substrate.

Other features and advantages of the present disclosure will be further explained in the following description, and partly become self-evident therefrom, or be understood through implementing the present disclosure. The objectives and other advantages of the present disclosure will be achieved through the structure specifically pointed out in the description, claims, and the accompanying drawings.

BRIEF DESCRIPTION OF THE DRAWINGS

In order to explain the technical solution of the embodiments of the present disclosure or the technical solution in the prior art in a clearer manner, the accompanying drawings used in illustrating the prior art or the embodiments of the present disclosure are briefly introduced as follows, in which.

DETAILED DESCRIPTION OF THE EMBODIMENTS

The embodiments of the present disclosure will be explained in detail with reference to examples and the accompanying drawings, whereby it can be fully understood how to solve the technical problem by the technical means according to the present disclosure and achieve the technical effects thereof, and thus the technical solution according to the present disclosure can be implemented. It is important to note that as long as there is no structural conflict, all the technical features mentioned in all the embodiments may be combined together in any manner, and the technical solutions obtained in this manner all fall within the scope of the present disclosure.

Meanwhile, various specific details are expounded in the following to provide a thorough understanding of the embodiments of the present disclosure. However, it is obvious for a person skilled in the art that, the present disclosure can be implemented through other specific details or in other specific manners than those described herein.

Figure 1:
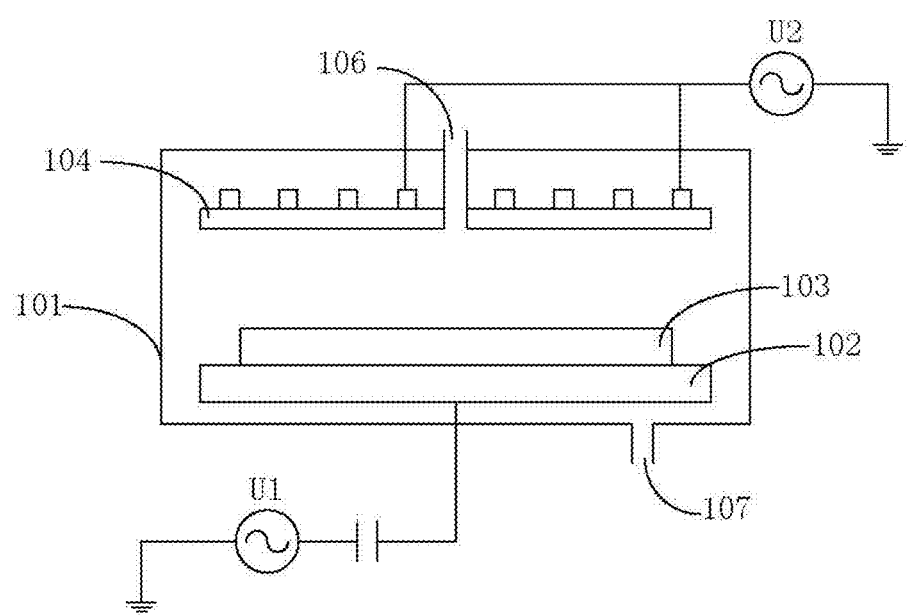
FIG. 1 schematically shows the structure of an ICP etching device.

FIG. 1 schematically shows the structure of an existing ICP etching device. As depicted in FIG. 1, a reaction chamber 101 of the ICP etching device is provided with therein a first electrode 102 and a second electrode 104 having an inductive coil, wherein the first electrode 102 and the second electrode 104 are connected to a first radio source U1, a second radio source U2, and relevant matching networks, respectively.

When a substrate 103 placed on the first electrode 102 is being etched, an etching gas enters the reaction chamber 101 via an air inlet 106. The second electrode 104 allows glow discharge of the etching gas through inductive coupling, and generates a high-density plasma gas, which performs etching on the substrate 103 under action of the first electrode 102.

ICP etching includes rather complex chemical and physical steps. The chemical steps substantially comprise two portions: one portion is glow discharge of the etching gas through inductive coupling, to produce active free radicals, metastable particles, atoms, and chemical interactions thereamong; and the other portion involves interactions between these active particles generated in the glow discharge of the etching gas and a surface of the substrate. The physical steps mainly involve bombardment against the surface of the substrate by ions.

Figure 2:
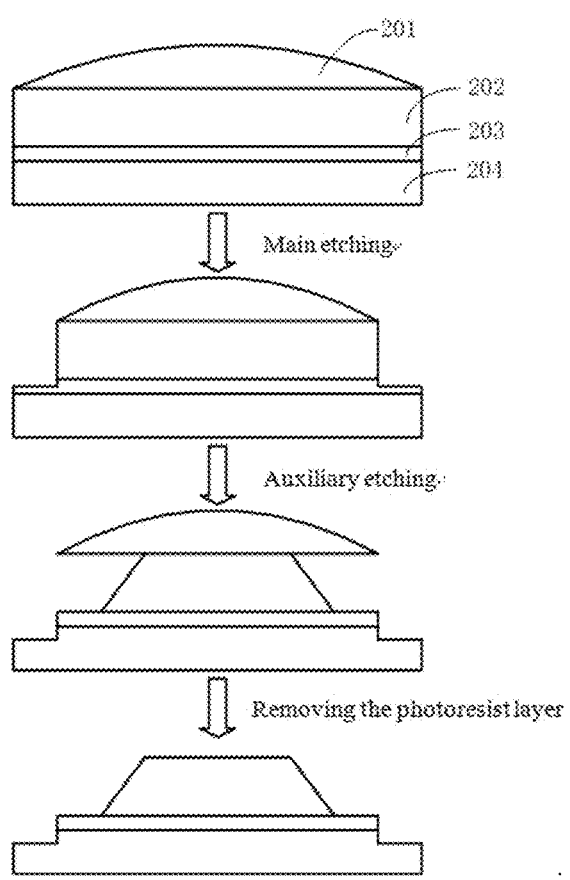
FIG. 2 shows an effect diagram when the ICP etching device is used to etch a substrate.
Figure 3A:
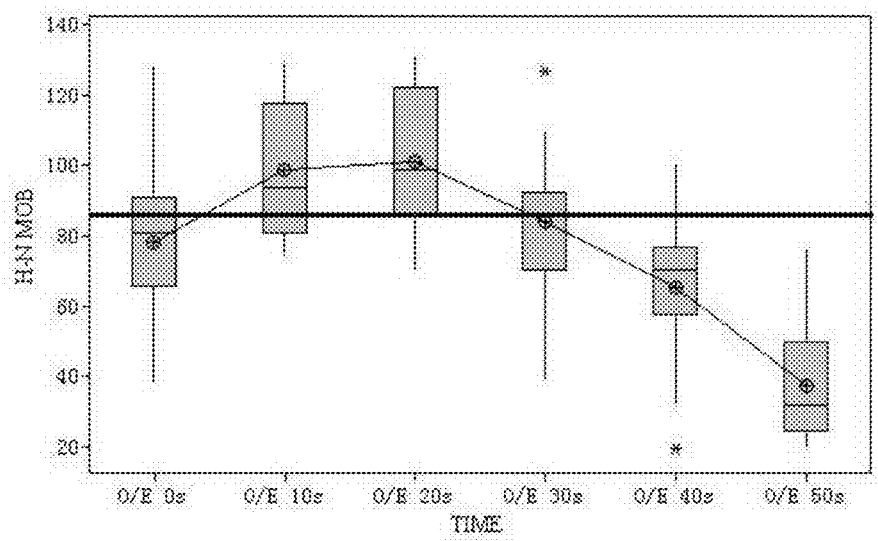
FIGS. 3a-3d show box-plots of electron mobility in a vertical direction, electron mobility in a horizontal direction, variation of resistance along with an over-etching amount, and variation of capacitance along with the over-etching amount, respectively.
Figure 3B:
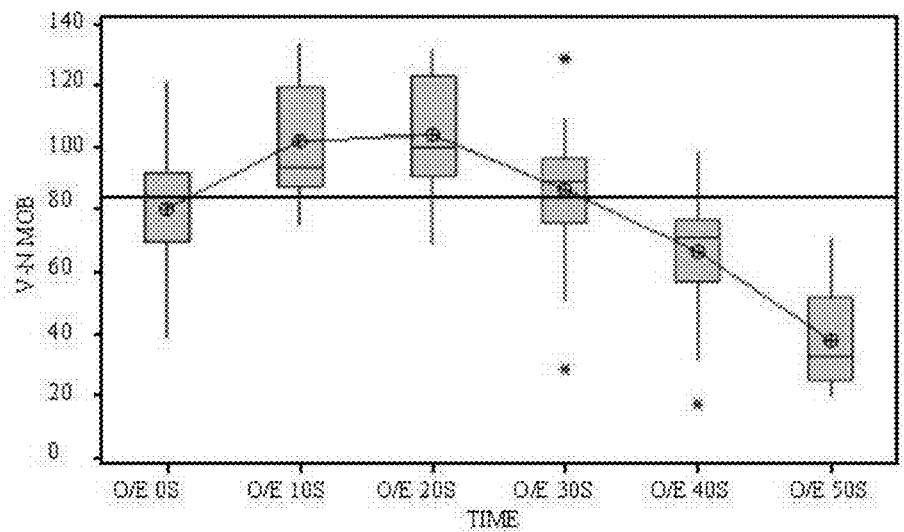
Figure 3C:
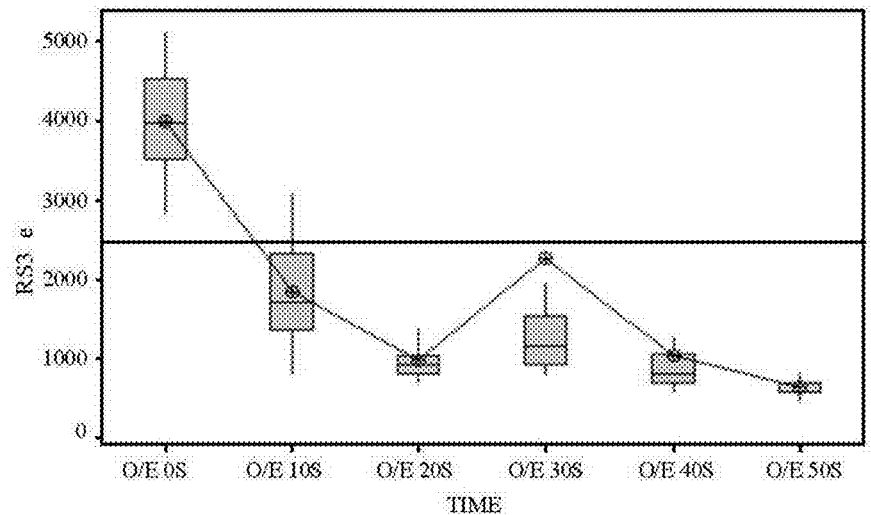
Figure 3D:
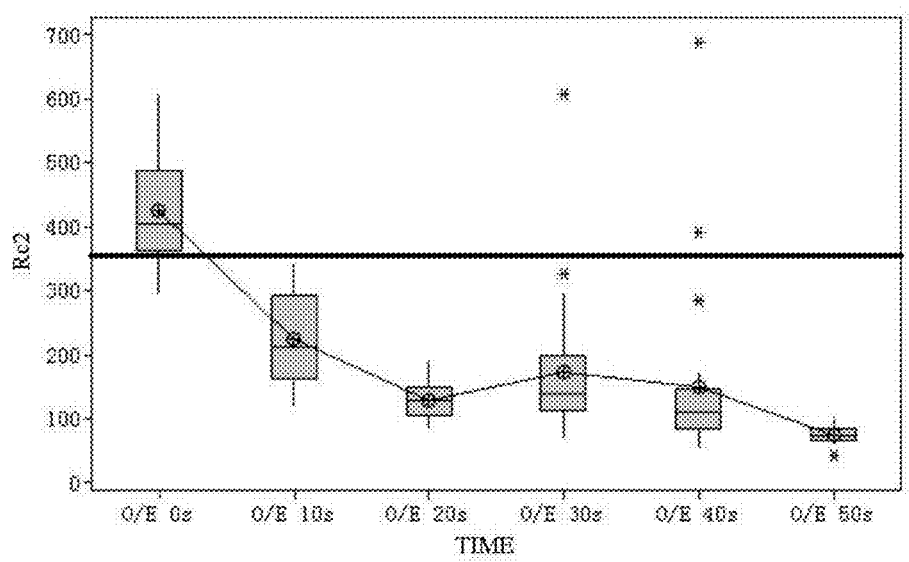

FIG. 2 shows an effect diagram when the substrate is etched by an ICP etching procedure.

The substrate to be etched as provided in the present embodiment comprises a photoresist layer 201, a metal layer 202, a first insulation layer 203, and a second insulation layer 204, among which the first insulation layer is a silicon nitride material having relatively weak bond energy, and the second insulation layer is a silicon oxide material having relatively strong bond energy.

As shown in FIG. 2, during a main etching step performed on the substrate coated with the photoresist layer 201, oxygen contained in an etching gas mixture (comprising sulfur fluoride and oxygen) causes an edge of the photoresist layer to move toward a center, so as to expose a corresponding region of the metal layer. By this time, the region of the metal layer 202 unshielded by the photoresist layer is etched along a plasma bombardment direction. Meanwhile, the first insulation layer 203 (i.e., a silicon nitride material layer) unshielded by the photoresist layer 201 is also partially etched along the plasma bombardment direction.

Subsequently, during an auxiliary etching step performed on a substrate obtained through the main etching step, the metal layer 202 forms a trapezoidal structure as required under action of a new etching gas mixture comprising chlorine and oxygen. Nevertheless, due to a high density of plasma in the reaction chamber of the ICP etching procedure, during the auxiliary etching step, not only a remaining portion of the first insulation layer 203 unshielded by the photoresist layer 201 is etched, but the unshielded second insulation layer (i.e., silicon oxide insulation layer) is also partially etched along the plasma bombardment direction, which renders the silicon oxide insulation layer over-etched.

However, from box-plots of electron mobility in a vertical direction, electron mobility in a horizontal direction, variation of resistance along with an over-etching amount, and variation of capacitance along with the over-etching amount respectively shown in FIGS. 3a-3d, it can be seen that, over-etching of the silicon oxide insulation layer will cause the electron mobility in a vertical direction, the electron mobility in a horizontal direction, the resistance, and the capacitance all to deviate from respective normal values, thereby deteriorating performance of the substrate.

Figure 4:
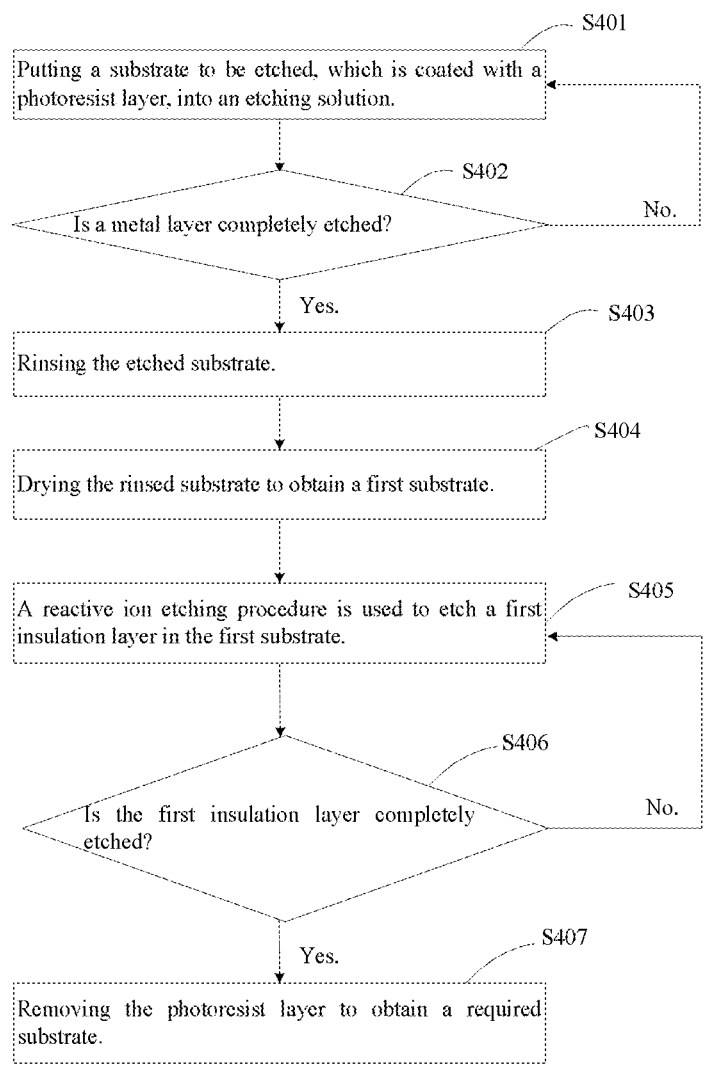
FIG. 4 shows a flow chart of an etching method according to one embodiment of the present disclosure.
Figure 5:
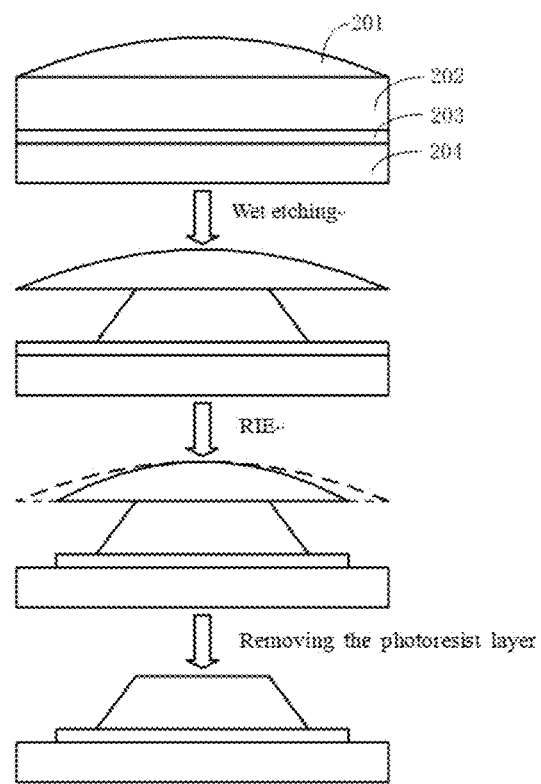
FIG. 5 shows an effect diagram when a substrate is being etched according to one embodiment of the present disclosure.

Directed against the above problems caused by the ICP etching procedure of the existing etching method, provided in the present embodiment is a new etching method, a flow chart and an effect diagram of which are shown in FIG. 4 and FIG. 5, respectively.

As FIG. 4 indicates, according to the etching method provided in the present embodiment, in step S401, a substrate to be etched, which is coated with a photoresist layer, is first put into an etching solution. The etching solution is used to etch a metal layer in the substrate. The purpose of step S401 is to decompose the metal layer necessary to be etched in the substrate to be etched, and convert the metal layer into a soluble compound, so as to remove excessive metal. Such an etching technique relies substantially on chemical reactions between the etching solution and the material of the metal layer of the substrate. Therefore, a proper etching rate and a favorable selection ratio can be achieved through control over selection, formulation, and temperature of the etching solution.

As FIG. 5 shows, similar with the substrate to be etched as illustrated in FIG. 2, the substrate to be etched as provided in the present embodiment also comprises a photoresist layer 201, a metal layer 202, a first insulation layer 203, and a second insulation layer 204, wherein the first insulation layer 203 and the second insulation layer 204 are respectively a silicon nitride material and a silicon oxide material, and the metal in the metal layer is molybdenum. In other embodiments of the present disclosure, of course, the first insulation layer, the second insulation layer, and the metal layer can be made of other proper materials, which are not limited hereto.

In order to decompose the metal layer necessary to be etched in the substrate, the etching solution is required to be able to react with the metal layer, but not to react with the silicon nitride material of the first insulation layer or the silicon oxide material of the second insulation layer. Therefore, an aluminic acid solution is used in the present embodiment as the etching solution, which is formed by mixed nitric acid, sulfuric acid, acetic acid, and a composite additive. The contents of nitric acid, sulfuric acid, and acetic acid in the aluminic acid solution can be 1.5%-2.0%, 65%-70%, and 15%-20%, respectively. In the present embodiment, in order to achieve higher etching rate and selection ratio, preferably, the contents of nitric acid, sulfuric acid, and acetic acid in the aluminic acid solution are respectively 1.8%, 67%, and 17%, which, of course, can be selected as other proper values as required in practice.

It should be noted that, in other embodiments of the present disclosure, other proper etching solutions can be used for different materials of the metal layer. For example, a solution comprising only one or two selected from the group consisting of nitric acid, sulfuric acid, and acetic acid can be used. The present disclosure is not limited hereto.

In order to assure a timely and accurate judgment at completion of a reaction, and to prevent the metal layer from being over-etched, when the substrate to be etched is put into the etching solution and being etched, in step S402 of the etching method according to the present embodiment, it is monitored whether the metal layer is completely etched. If yes, the substrate after being etched will be washed in step S403; while if no, the metal layer will be further etched.

In the present embodiment, an organic stripping liquid is used to rinse the substrate. Of course, in other embodiments of the present disclosure, other proper liquids, such as an aqueous stripping liquid containing an organic, can be used to perform rinsing on the substrate. The present disclosure is not limited hereto.

The higher the concentration or reaction temperature of the etching solution is, the larger the etching rate of the metal layer will be. The chemical reaction between the metal layer and the etching solution is an exothermic reaction. Therefore, during wet etching, the temperature at a position adjacent to the metal layer in the etching solution will be apparently higher than the temperature in any other positions. Such inhomogeneous temperature distribution in the etching solution might prevent accurate control over reaction temperature of the wet etching, thereby causing the phenomenon of over-etching or insufficient etching of the metal layer.

In order to solve this problem, while the etching method of the present embodiment is used to perform wet etching on the metal layer, the etching solution can be stirred to ensure homogeneous temperature distribution therein, thus eliminating unfavorable influences on control over reaction by inhomogeneous temperature distribution.

Besides, the reaction between some metals and the etching solution would generate gases, thus forming bubbles in the etching solution. Such bubbles in the etching solution might cause some metal layers to be isolated from the etching solution, thereby stopping chemical reaction between the etching solution and the metal layer.

In order to solve this problem, the etching method of the present embodiment further includes defoaming and degassing steps performed on the etching solution, so as to remove the bubbles in the etching solution, and enable adequate contact between the etching solution and a corresponding surface of the metal layer. Specifically, ultrasonic waves are used in the present embodiment to perform defoaming and degassing steps on the etching solution. In other embodiments of the present disclosure, of course, other proper means can be used to perform degassing on the etching solution. The present disclosure is not limited hereto.

In step S404, the substrate after being rinsed is dried to obtain a first substrate. FIG. 5 schematically shows a substrate, i.e., the first substrate, obtained through wet etching according to the present embodiment. As shown in the figure, after the etching method provided in the present embodiment is used to perform wet etching on the substrate to be etched, which is coated with a photoresist layer, the metal layer in the first substrate obtained forms a trapezoidal structure as required, thus achieving etching requirements on the metal layer, while the first insulation layer and the second insulation layer are completely protected.

As indicated in FIG. 4, after the metal layer is completely etched, in step S405 of the etching method according to the present embodiment, a reactive ion etching (RIE) procedure is used to etch the first insulation layer in the substrate, so as to achieve the purpose of removal of the first insulation layer unshielded by the photoresist layer. While the RIR procedure is employed to etch the substrate, it is further detected in step S406 whether the first insulation layer is completely etched. If the first insulation layer is completely etched, the photoresist layer will be removed in step S407, so as to obtain the required substrate. Otherwise, the first insulation layer of the substrate will continue to be etched.

Figure 6:
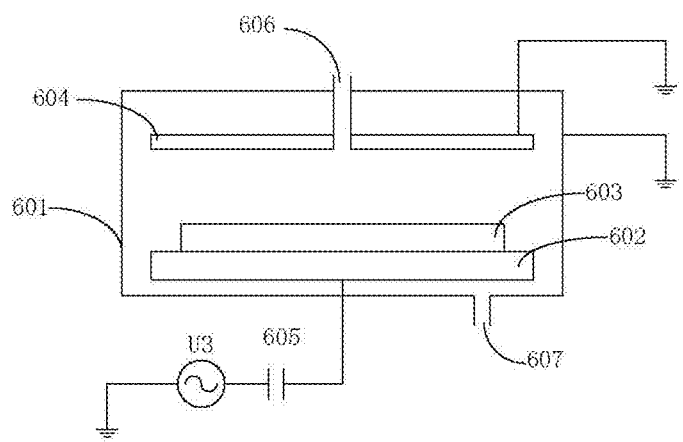
FIG. 6 schematically shows the structure of an RIE device according to one embodiment of the present disclosure.

The RIE procedure is an etching procedure in which physical and chemical effects coexist. FIG. 6 schematically shows the structure of an RIE device. As depicted in FIG. 6, the RIE device comprises a reaction chamber 601, an electrode 602, a polar plate 604, a radio source U3, and a matching network 605. During an etching step, an etching gas enters the reaction chamber 601 through an air inlet 606 provided on the reaction chamber 601. A magnetic field generated by the radio source U3 enables glow discharge of the etching gas in the reaction chamber 601. The etching gas is penetrated and thereby generates plasma, which includes ions, free radicals, and free electrons. Chemical reactions can occur between these particles and a surface of an etching sample. Meanwhile, the ions, under action of an electric field, shoot against a substrate 603 located on the electrode 602, and perform physical bombardment against a surface of the substrate 603. Gases generated during the etching step are discharged out of the reaction chamber 601 via an air outlet 607.

Compared with the ICP etching device, the RIE device has one less radio source, such that the plasma in the reaction chamber of the RIE device has a much lower density than that in the reaction chamber of the ICP etching device, and the variety of plasma generated during glow discharge of the etching gas is much less in the reaction chamber of the RIE device than in the reaction chamber of the IPC etching device. As a result, when the RIE procedure is used to etch the first insulation layer and the second insulation layer of the substrate, the plasma generated can only etch the material of the first insulation layer (e.g., silicon nitride) which has relatively low bond energy, while the material of the second insulation layer (e.g., silicon oxide) which has relatively high bond energy cannot be etched.

In the present embodiment, the selection ratio of etching can be adjusted through adjustment of proportion and flow of various gases in the etching gas mixture. The selection ratio of etching, an important parameter in the RIE procedure, refers to a specific ratio of an etching rate of the materials to be etched to an etching rate of materials unexpected to be etched. In recent years, as a photolithography technology rapidly develops, the lines produced are getting thinner. In order to acquire a higher image resolution, a resist coating (i.e., photoresist layer) should be as thin as possible. This attaches increasingly higher requirements on the selection ratio. A satisfactory selection ratio lies substantially in generation of proper chemical active substances during gas discharge. Thus, in the present embodiment, the selection ratio is adjusted through adjustment of concentration ratio of various gases in the etching gas mixture. Absolutely, in other embodiments of the present disclosure, a satisfactory selection ratio can be obtained through other proper means, for example, introduction of a new catalytic gas (e.g., oxygen). The present disclosure is not limited hereto.

Moreover, the etching rate of reactive ions has an obvious relationship with the flow of the etching gas mixture. As the flow of the etching gas mixture increases, the etching rate first rises, and after the flow of the etching gas mixture reaches a maximum value, the etching rate decreases slightly under a relatively high flow of gases. This is because under a low flow of etching gases, the etching rate is substantially limited by an insufficient supply of active substances, while under a high flow of etching gases, the etching rate is mainly influenced when the active substances are taken away. As a result, according to the etching method provided in the present embodiment, the etching rate can be further controlled through control over the flow of the etching gas mixture.

It should be noted that, in other embodiments of the present disclosure, other proper means, such as adjustment of radio frequency power, can also be used to control the etching rate. The present disclosure is not limited hereto.

In the present embodiment, the etching gas mixture used comprises chlorine and sulfur fluoride. In other embodiments of the present disclosure, of course, other proper gases, such as a gas mixture of sulfur fluoride and oxygen, can also be used as the etching gases. The present disclosure is not limited hereto.

The present embodiment further provides a substrate manufactured by use of the above etching method. The second insulation layer of the substrate is non-etched. The RIE etching result as schematically shown in FIG. 5 indicates that, according to the etching method provided in the present embodiment, the RIE procedure is employed to effectively prevent etching to the second insulation layer that would be otherwise caused, i.e., the phenomenon of overetching, due to use of the ICP etching procedure. This ensures homogeneity and reliability of the substrate obtained after etching, and enables parameters of the substrate, such as electric mobility, resistance, and capacitance thereof to be approximate to specified values, thereby guaranteeing yield of the substrate.

In addition, compared with the ICP etching device as used in an existing etching method, the wet etching device and the RIE device used in the present embodiment are of lower costs. Therefore, the method of the present disclosure can be used favorably for lowering manufacturing costs and improving production efficiency of the substrate.

It could be understood that, the embodiments disclosed herein are not limited by the specific structures, treatment steps, or materials disclosed herein, but incorporate the equivalent substitutes of these features which are comprehensible to those skilled in the art. It could be also understood that, the terms used herein are used for describing the specific embodiments, not for limiting them.

The phrases "one embodiment" or "embodiments" referred to herein mean that the descriptions of specific features, structures and characteristics in combination with the embodiments are included in at least one embodiment of the present disclosure. Therefore, the phrases "one embodiment" or "embodiments" that have appeared in different parts of the whole description do not necessarily refer to the same embodiment.

For the purpose of convenience, a plurality of items, structural units, component units and/or materials used herein can be listed in a common list. However, the list shall be understood in a way that each element thereof represents an only and unique member. Therefore, when there is no other explanation, none of the members of the list can be understood as an actual equivalent of other members in the same list only based on the fact that they appear in the same list. In addition, the embodiments and examples of the present disclosure can be explained with reference to the substitutes of each of the components. It could be understood that, the embodiments, examples and substitutes herein shall not be interpreted as the equivalents of one another, but shall be considered as separate and independent representatives of the present disclosure.

In addition, the features, structures and characteristics described herein can be combined with one another in any other suitable way in one embodiment or a plurality of embodiments. The specific details, such as lengths, widths and shapes, described herein are used for providing a comprehensive understanding of the embodiments of the present disclosure. However, it is understandable for those skilled in the art that, the present disclosure may be implemented in other ways different from the specific details specified herein, or may be implemented in other methods, components and materials. The structures, materials and operations known to all are not shown or described in the examples to avoid blurring various aspects of the present disclosure.

The embodiments are described hereinabove to interpret the principles of the present disclosure in one application or a plurality of applications. However, those skilled in the art, without departing from the principles and thoughts of the present disclosure, can make various modifications to the forms, usages and details of the embodiments of the present disclosure without any creative work. Therefore, the protection scope of the present disclosure shall be determined by the claims.

The invention claimed is:

1. An etching method, comprising:
   a wet etching step, which includes: putting a substrate to be etched, which is coated with a photoresist layer, into an etching solution, and etching a metal layer of the substrate to be etched, to obtain a first substrate; and
   a reactive ion etching step, which includes: etching a first insulation layer of the first substrate with a reactive ion etching procedure, and then removing the photoresist layer, to obtain a substrate with a second insulation layer thereof being non-etched.

2. The method of claim 1, wherein the wet etching step further includes rinsing and/or drying the substrate after the metal layer of the substrate to be etched is etched.

3. The method of claim 1, wherein the wet etching step further includes stirring the etching solution.

4. The method of claim 1, wherein the wet etching step further includes degassing the etching solution.

5. The method of claim 1, wherein the etching solution comprises sulfuric acid, nitric acid, and/or acetic acid.

6. The method of claim 5, wherein in the etching solution, the proportions of sulfuric acid, nitric acid, and acetic acid are respectively 1.8%, 67%, and 17%.

7. The method of claim 1, wherein an etching gas mixture is used to etch the first insulation layer of the first substrate, and in the reactive ion etching step, a selection ratio of etching is adjusted through adjustment of proportions of various gases in the etching gas mixture.

8. The method of claim 7, wherein the etching gas mixture comprises chlorine and sulfur fluoride.

9. The method of claim 1, wherein in the reactive ion etching step, an etching rate is further adjusted through adjustment of flow of the etching gas mixture.

\* \* \* \* \*